(12) United States Patent
Pommer et al.

(10) Patent No.: US 6,607,939 B2
(45) Date of Patent: Aug. 19, 2003

(54) METHOD OF MAKING A MULTI-LAYER INTERCONNECT

(75) Inventors: Richard Pommer, Orange, CA (US); Simon McElrea, Orange, CA (US); Brad Banister, Orange, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/028,261

(22) Filed: Dec. 18, 2001

(65) Prior Publication Data

US 2002/0092159 A1 Jul. 18, 2002

Related U.S. Application Data

(62) Division of application No. 09/432,200, filed on Nov. 2, 1999, now Pat. No. 6,388,325.

(51) Int. Cl.[7] .............................................. H01L 21/44
(52) U.S. Cl. ................... 438/110; 438/121; 438/122; 438/123; 438/128; 438/129; 438/597; 438/598; 438/599; 438/618; 438/622
(58) Field of Search ................................. 438/121–123, 438/128–129, 597–599, 618, 622, 110; 257/700–703

(56) References Cited

U.S. PATENT DOCUMENTS

| | | | | |
|---|---|---|---|---|
| 3,790,866 A | * | 2/1974 | Meyer et al. ............... 257/702 |
| 3,803,458 A | * | 4/1974 | Morena, Jr. ................. 257/701 |
| 4,351,101 A | * | 9/1982 | Young ....................... 29/577 C |
| 4,866,507 A | * | 9/1989 | Jacobs et al. ............... 257/700 |
| 5,466,634 A | * | 11/1995 | Beilstein, Jr. et al. ...... 437/180 |
| 5,512,765 A | * | 4/1996 | Gaverick ................... 257/202 |
| 5,672,911 A | * | 9/1997 | Patil et al. ................. 257/700 |
| 5,808,330 A | * | 9/1998 | Rostoker et al. ........... 257/208 |
| 5,942,046 A | | 8/1999 | Kahlfuss et al. ........... 136/251 |
| 6,134,776 A | * | 10/2000 | Hoffmeyer .................. 257/700 |
| 6,312,980 B1 | * | 11/2001 | Rostoker et al. ........... 438/197 |

FOREIGN PATENT DOCUMENTS

| | | |
|---|---|---|
| EP | 0 938 141 A2 | 8/1999 |
| GB | 2 224 391 A | 5/1990 |
| JP | 61171067 | 8/1986 |
| WO | WO 98/26476 | 6/1998 |

* cited by examiner

*Primary Examiner*—John F. Niebling
*Assistant Examiner*—Lynne A. Gurley
(74) *Attorney, Agent, or Firm*—Riordan & McKinzie; Sandra P. Thompson

(57) ABSTRACT

Methods and apparatus for increasing the yield achieved during high density interconnect (HDI) production. In particular, processes in which panels are tested to identify good cells/parts, good cells are removed from the panels, and new panels created entirely of identified/known good cells allow increases in the number of layers used in a HDI without incurring the decrease in yield normally associated with such a layering process.

4 Claims, 9 Drawing Sheets

METHOD OF MAKING A MULTI-LAYER INTERCONNECT

This application is a divisional of pending application Ser. No. 09/432,200 filed Nov. 2, 1999 now U.S. Pat. No. 6,388,325.

FIELD OF THE INVENTION

The field of the invention is multi-layer substrates/interconnects.

BACKGROUND OF THE INVENTION

An integrated circuit (IC) package is a housing which environmentally protects the IC, facilitates testing of the IC, and facilitates the use of the IC in high-yield assembly processes. Such a package functions to protect an IC from mechanical and environmental stresses and electrostatic discharge. It also functions to provide a mechanical interface for testing, burn-in, and interconnection to a higher level of packaging such as a circuit card.

In many IC packages a substrate acts as an interconnecting layer between the terminals or pads on the IC, and the connectors or leads of the package. The substrate is typically mechanically and electrically coupled to both the IC and the package leads. The substrate may be made from a ceramic or organic material, may be rigid or flexible, and may comprise a single layer or multiple layers laminated together.

As IC technology progresses, there is a growing need for higher density interconnecting layers. The process used by the printed circuit board industry to build high density interconnects typically starts with providing a large multi-layered printed circuit board core having 2–6 layers with drilled and plated through holes. Individual parts are stepped and repeated on the core to produce a panel of parts. A high density interconnect (HDI) comprises multiple panels/layers. HDI layers are typically either added sequentially, layer by layer or layers are made individually and then laminated in mass.

Each layer/panel of an HDI generally has good and bad parts. The percentage of the total number of parts which are good is typically specified as percentage yield. For a single panel/layer it is not uncommon to achieve a yield of 90%. However, since each layer has less than 100% yield, and since bad parts tend to be distributed randomly throughout the panel, each layer added to an HDI panel tends to decrease the number of good parts on, and thus the yield of, the panel. Thus, a two layer interconnect comprising two 90% panels may have a yield of 81%, i.e. 81% of the individual parts/cells on the panel are good. A three layer interconnect may have a yield of 73%, four layers 66%, and five layers 60%. This decrease in yield as the number of layers is increased is undesirable. Thus, there is a continuing need to develop new forms and new method for producing high density interconnects.

SUMMARY OF THE INVENTION

The present invention is directed to methods and apparatus for increasing the yield achieved during high density interconnect (HDI) production. In particular, processes in which panels are tested to identify good cells/parts, good cells are removed from the panels, and new are panels created entirely of the identified/known good cells allow increases in the number of layers used in a HDI without incurring the decrease in yield normally associated with such a layering process.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWINGS

FIG. 7b is a detailed view of a joint between two cells of FIG. 7a.

DETAILED DESCRIPTION

Figure 1:
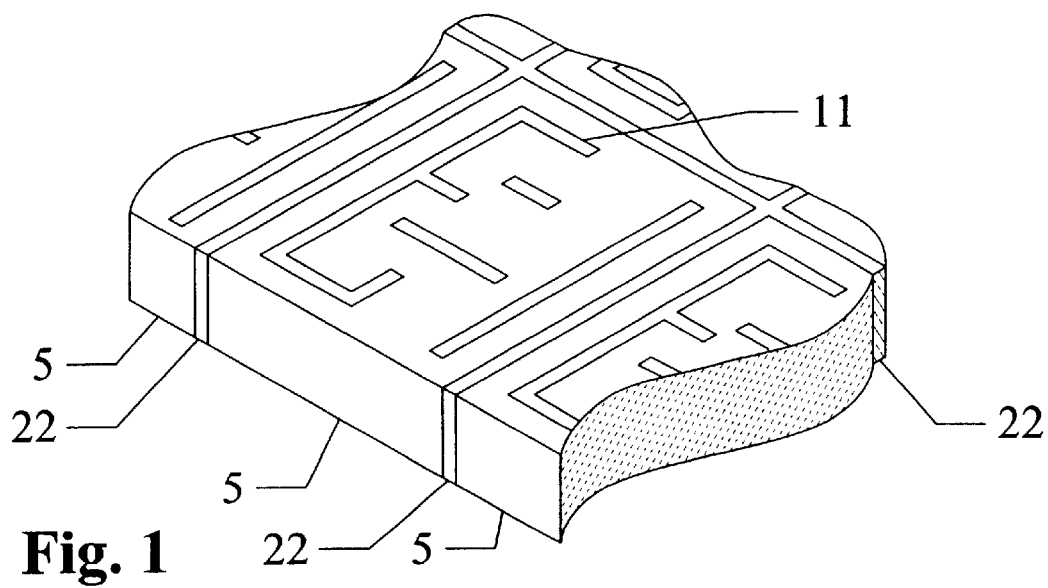
FIG. 1 is a perspective view of a portion of a multi-celled assembly embodying the invention.

Referring to FIG. 1, an assembly 1 of HDI cells 5 can be seen to be a multi-celled assembly comprising a plurality of cells 5 wherein each cell 5 is bound to adjacent cells 5 and adhesive material 22. Cells 5 are preferably laid out horizontally to form a rectangular panel or a linear strip of interconnected cells, but may have other forms as well. If formed into a rectangular panel, cells 5 are preferably laid out in rows and columns with the number of cells in each row preferred to be but not necessarily equal to the number in the other rows and the number of cells in each column preferred to be but not necessarily equal to the number in the other columns. Although not limited in number or particular layout, it is contemplated that panels having a total of T cells arranged in rows containing X cells and columns containing Y cells where (T, X, Y) are (4, 2, 2), (4, 1, 4), (7, 1, 7), (8, 2, 4), (9, 3, 3), (9, 1, 9), (12, 3, 4), (16, 4, 4), (16, 1 6), (25, 5, 5), (36, 6, 6) may be particularly desirable. If formed into linear strips it is contemplated that 1 or more parallel rows having a large number of columns may be rolled for ease in later transportation, handling and processing.

Cells 5 may each have unique shapes, or, as shown in FIG. 1, to comprise a uniform interlocking shape. However, it is currently preferred that cells 5 comprise uniform rectangular shapes. It is contemplated that uniformity between cells is advantageous when forming new multi-celled units from the good cells. It is also contemplated that making the shapes interlocking helps to prevent untimely separation of the cells. However, with an appropriate choice of adhesive material 22 non-interlocking rectangular shapes are sufficient, and alternative shapes such as ovals may be chosen.

Figure 2:
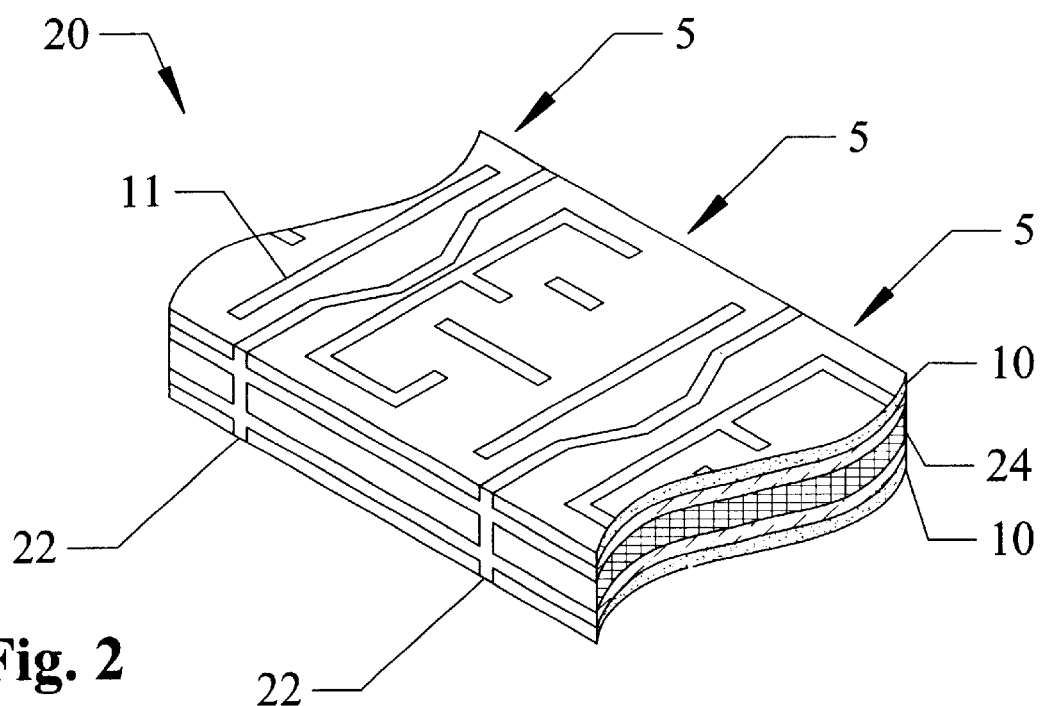
FIG. 2 is a perspective view of a portion of a multi-celled assembly embodying the invention.

Referring to FIG. 2, cells 5 can be seen to comprise layer-pairs 10 and bond-ply layers 20. Although cells comprising a single layer-pair 10 are contemplated, the assembly and methods disclosed herein are thought to be particularly advantageous when the cells 5 are stacks of alternating layer-pairs 10 and bond-ply layers 20 and the cells/stacks 5 have layer-pairs 10 on both ends of the stack.

Figure 3:
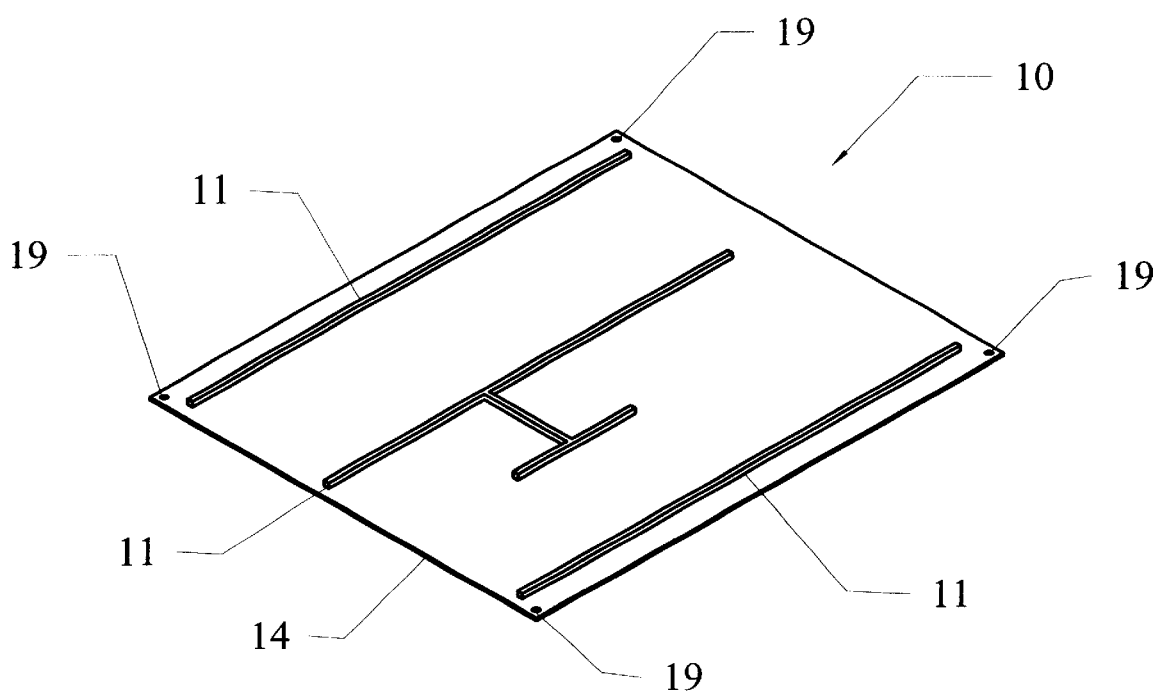
FIG. 3 is a perspective view of a layer-pair according to the disclosed invention.
Figure 4:
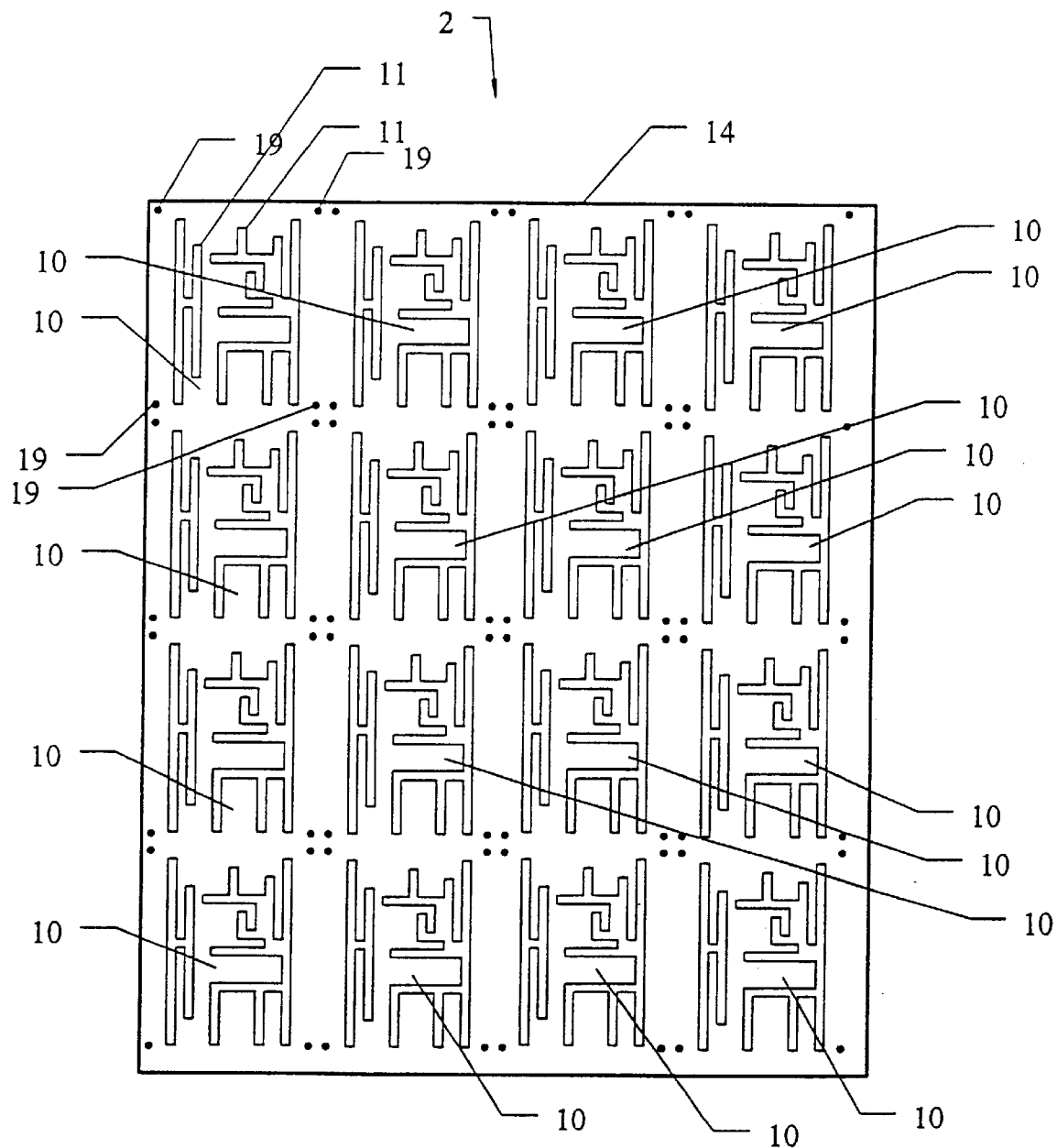
FIG. 4 is a top view of a panel of layer-pairs according to the disclosed invention.

Referring to FIG. 3, layer-pairs 10 are preferred to comprise a layer of polyimide film 14 bearing conductive patterns 11 on its upper and lower surfaces. The "pair" portion of the term "layer-pair" is indicates that two opposing sides of the base layer bear conductive patterns. Less preferred embodiments may utilize layer-pairs having non-polyimide base layers, or may use layers having conductive patterns on only one side (i.e. a substrate having a conductive pattern on one side and a metallized but relatively unpatterned opposing side such as a ground plane) in place of one or more layer-pairs. Layer pairs 10 are also preferred to include alignment/tooling pin holes 19.

Layer-pairs 10 are preferably formed by the following process: providing a panel of polyimide film, laser drilling through holes/vias in the panel; sputtering chromium and copper layers onto the panel; and producing conductive patterns on opposing sides of the panel by submitting the sputtered surfaces to a photolithographic process. Referring to FIG. 3, this process can be used to produce a plurality of panels 2, each panel containing multiple layer-pairs 10 interconnected by the common polyimide film base layer 14 of the layer pairs 10. The individual layer-pairs 10 on each panel are then inspected and/or electrically tested to identify good parts.

Figure 5:
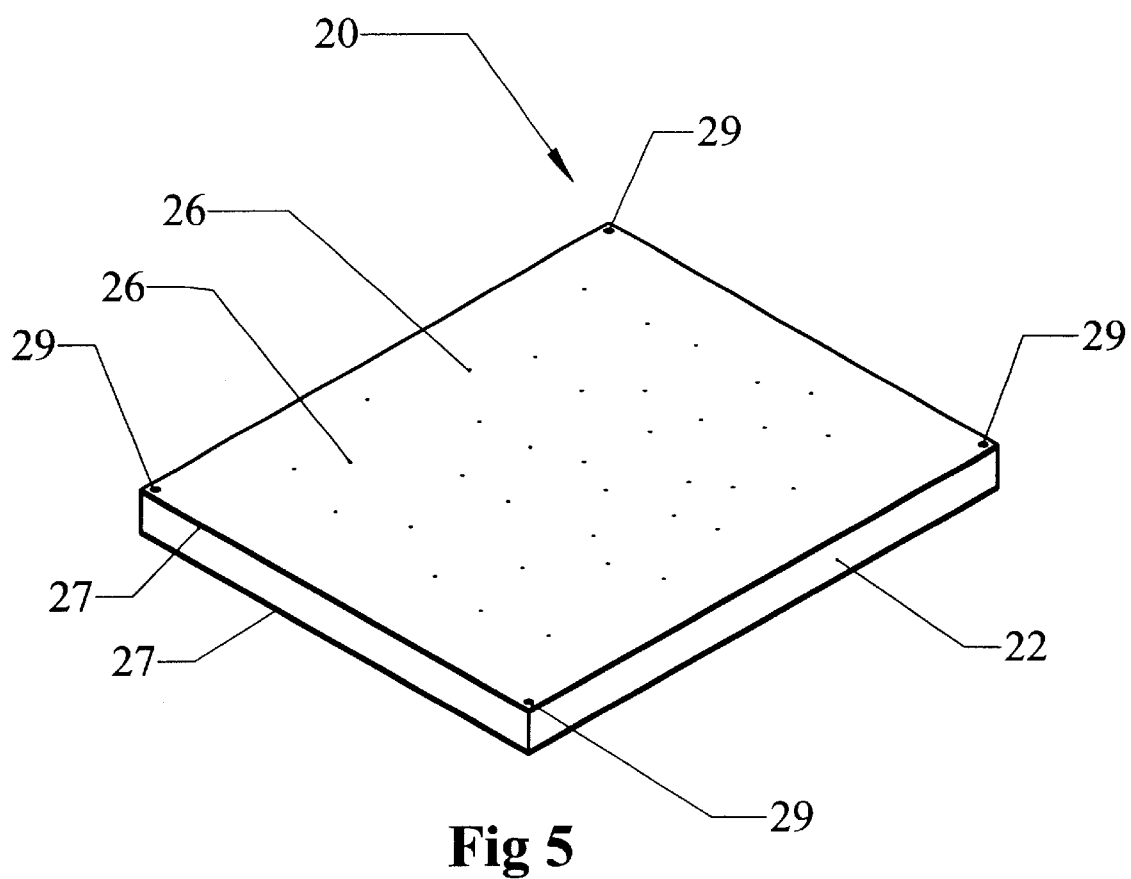
FIG. 5 is a perspective view of a bond-ply according to the disclosed invention.

Referring to FIG. 5, bond-ply layers 20 are preferred to comprise 1 non-adhesive layer 24 between adhesive layers 22, and to have conductive vias 26 passing through the layers from one side to the other. The materials used in the adhesive and non-adhesive layers may differ as it is preferred that the non-adhesive material be chosen to provide sufficient stability and support while the adhesive is chosen to have desirable adhesive and flow characteristics. In preferred embodiments, the conductive vias 26 passing through layers 24 and 26 comprise a conductive metallic ink filled hole passing through the non-adhesive layer 24 and terminating in a pair of posts or nubbins extending into and possibly through the opposing adhesive layers 26. It is contemplated that alternative embodiments may use something other than conductive metallic ink filled through holes to establish conductive paths 26 through the bond-ply layers 20. It is also contemplated that bond-ply layers 20 which, at least prior to lamination, do not include conductive paths 26 extending through them may be used if alternative methods are used to establish electrical conductivity between layer-pairs 10.

Figure 7A:
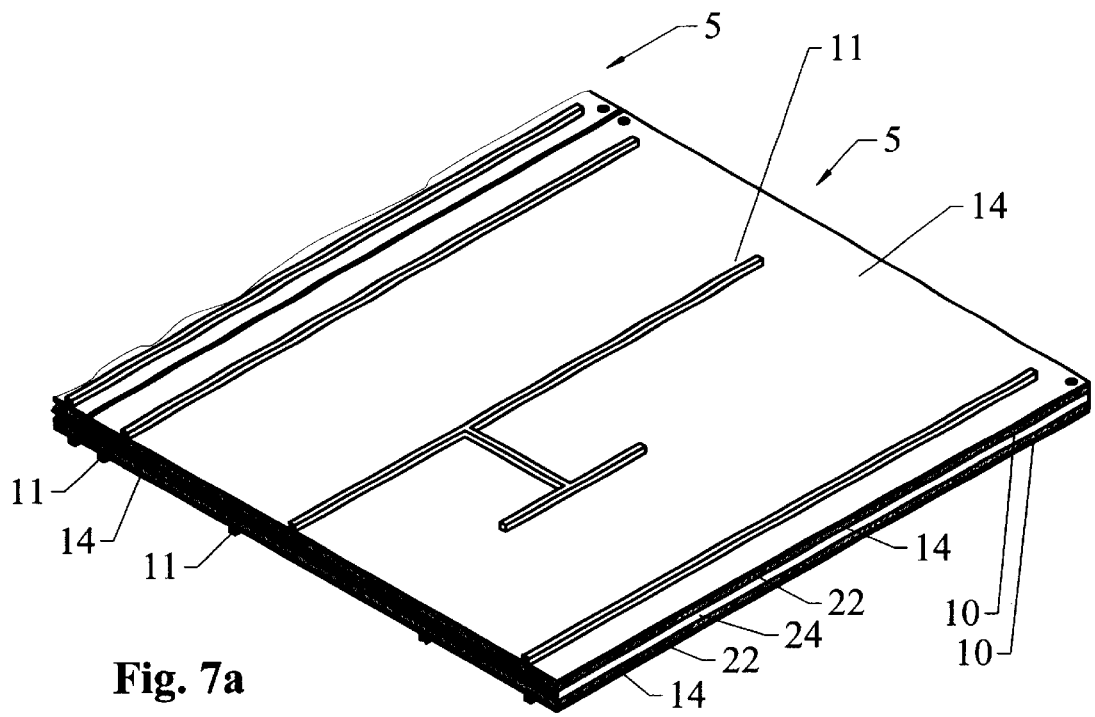
FIG. 7a is a perspective view of a portion of a multi-celled assembly embodying the invention.
Figure 7B:
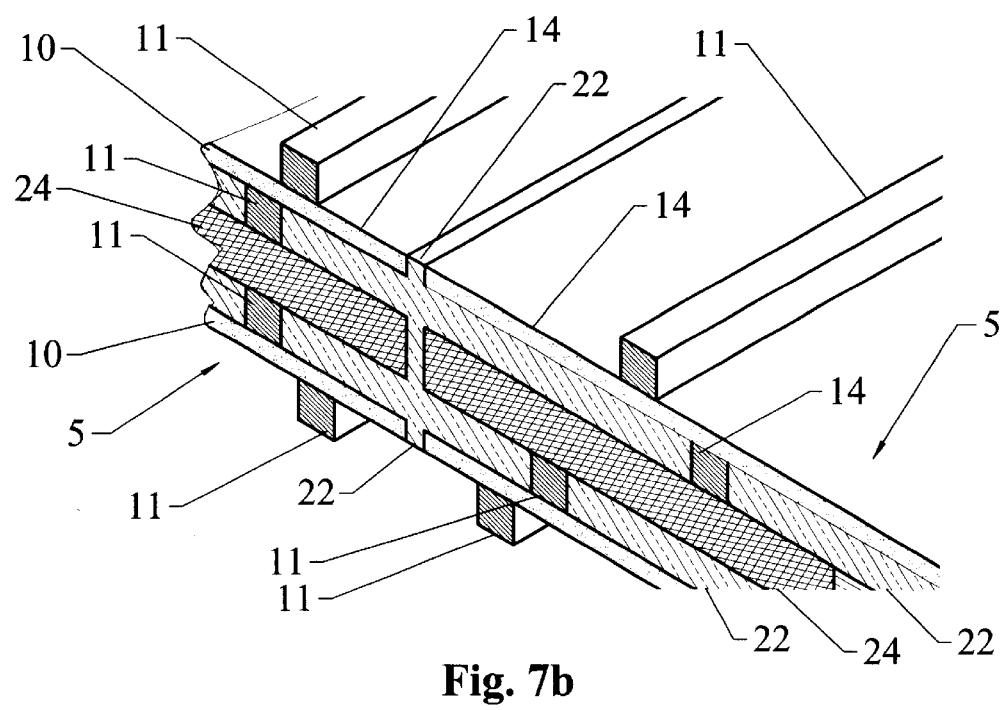

Referring to FIGS. 7a and 7b, when stacked, each adhesive layer 22 of the bond-ply layers 20 will mate with a surface of a layer-pair 10 bearing a conductive pattern 11. Conductive pattern 11 will typically comprise a raised portion of the surface of layer-pair 10. If one were to view a "slice" of the layer-pair which included only one of its conductive patterns it would be seen that the volume of the slice is only partially filled by the conductive pattern, and differences in conductive patterns would result in such a slice having more or less non-filled volume. When stacked, the adhesive layer 22 of the bond-ply layers 20 will typically flow between the raised portions of the conductive pattern 11 to fill this previously non-filled volume. The adhesive has to fill the gaps where the copper isn't. It is contemplated that, because different patterns have differing amounts of "non-filled volume", that the volume of material included in a particular adhesive layer 22 may be adjusted to correspond, at least in part, to the amount of "non-filled volume" of the mating layer-pair surface. In such embodiments, the volume of adhesive material in any two of the adhesive layers 22 of the bond-ply 20 may differ.

Although the choice of materials for use in the adhesive layers 22 is largely unrestrained, it is preferred that the adhesive layers comprise a polymer preferably based on high Tg chemistries. It is also preferred that a transient liquid phase sintering conductive ink be used in forming conductive paths 26.

Figure 6:
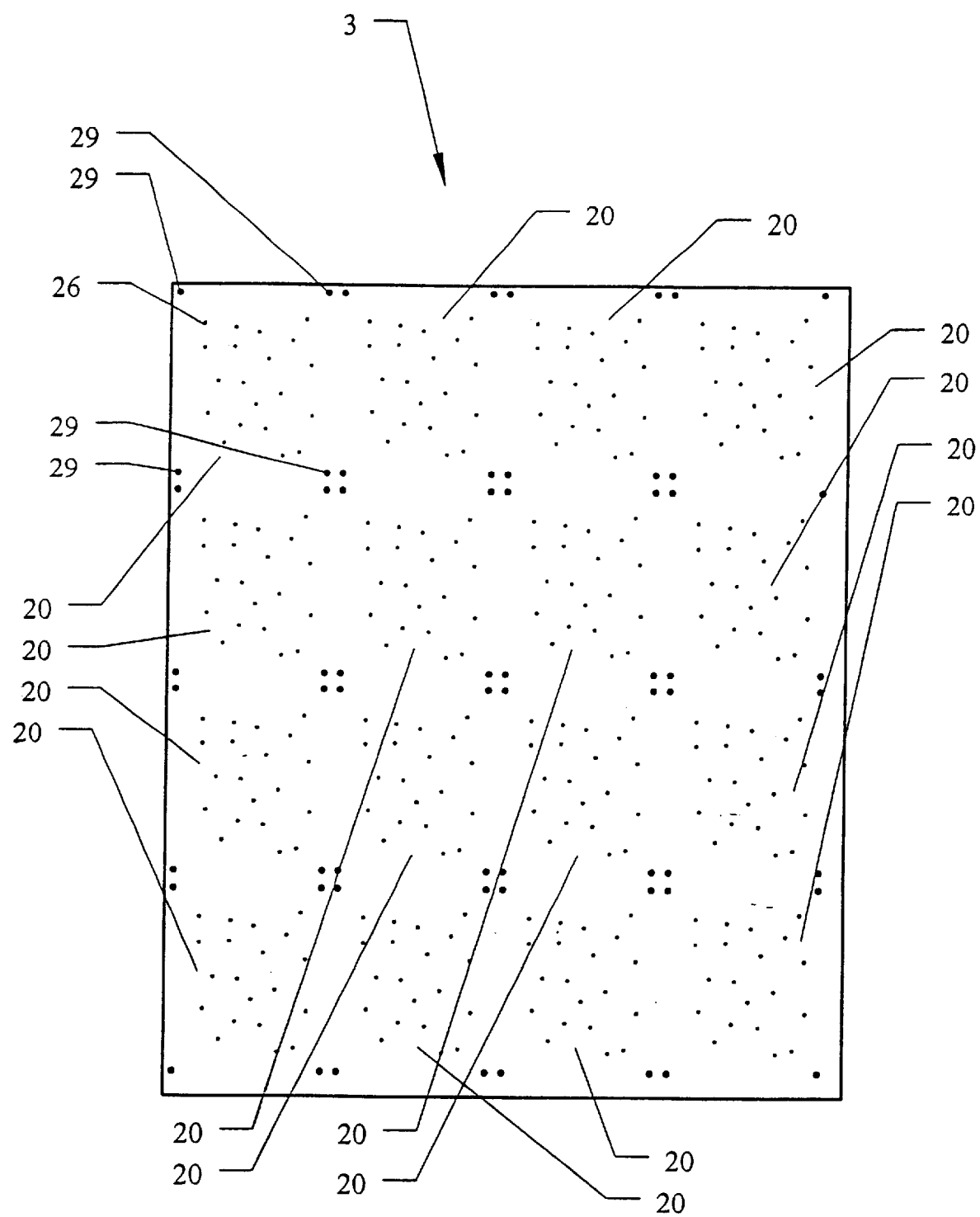
FIG. 6 is a top view of a panel of bond-plys according to the disclosed invention.

Bond-ply layers 20 are preferably formed by the following process: providing an adhesive coated base layer (i.e. a having a non-adhesive layer sandwiched between two adhesive layers), the outer surfaces of the adhesive layers being covered by a protective release sheets 27; laser drilling through holes/vias into the protected base layer; and pressure filling the through holes with conductive ink. Release sheets 27 are preferably polymer based, but alternative materials such as copper may be utilized as well. Referring to FIG. 6, this process can be used to produce a plurality of bond-ply panels 3, each panel containing multiple bond-plys 20 interconnected by the base layer 24. The individual bond-plys 20 on each panel are then inspected and/or electrically tested to identify good parts.

It is contemplated that the pressure fill step may be improved in a number of ways including orienting the bond-ply layer during the pressure fill process such that the process fills the through holes through either the laser entry or exit points of the through holes; optically registering the stencil used in the fill process rather than mechanically (which is the predominant method used by the industry); ramping up (i.e. slowly increasing) the pressure used in the pressure fill process; using a repeated and preferably automated apply, fill, and release cycle in applying the stencil and/or ink to the bond-ply layer, fill the vias, and release/remove the stencil from the bond-ply layer; and using a porous ceramic chuck with a layer of z-permeable paper between the chuck and the lamination plate.

A method for producing a HDI as previously described comprises providing known good layer-pair and bond-ply layers, forming stacks of alternating layers of known good layer-pair and bond-ply layers, and laminating the stacks so as to form them into a panel of HDIs.

Figure 8:
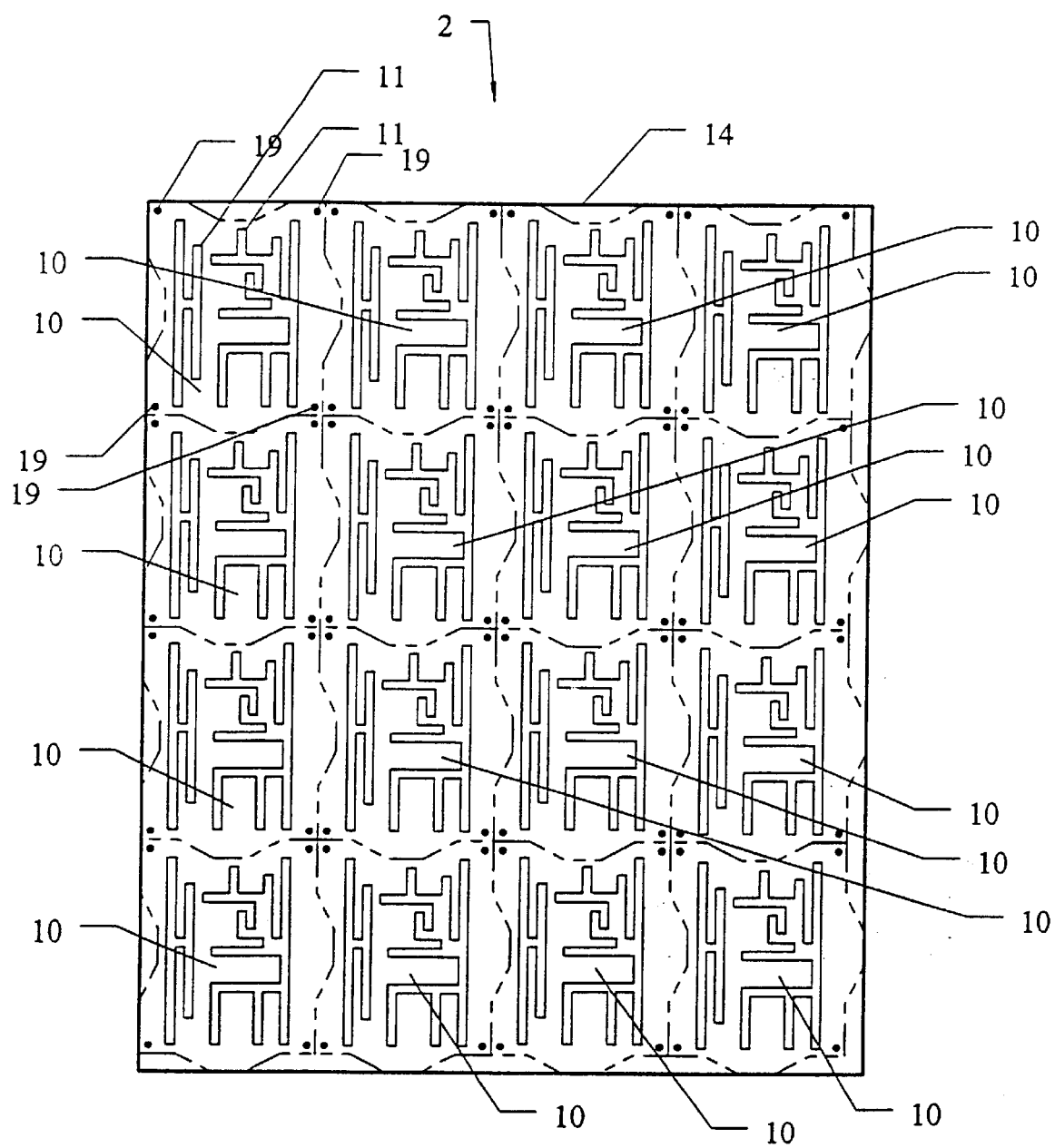
FIG. 8 is a top view of the panel of FIG. 4 having a phantom cutting/singulation pattern superimposed.
Figure 9:
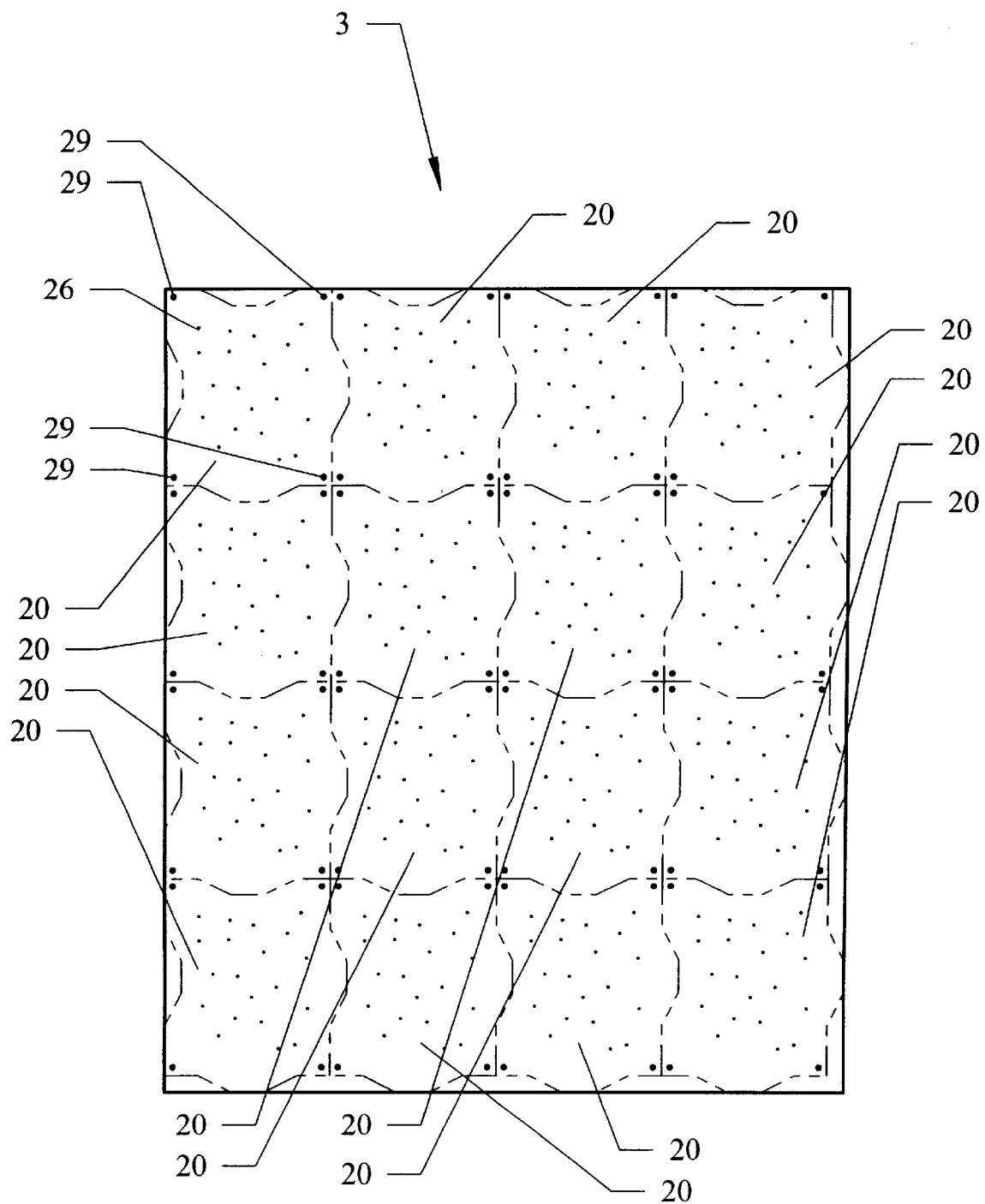
FIG. 9 is a top view of the panel of FIG. 6 having a phantom cutting/singulation pattern superimposed.

Referring to FIGS. 8 and 9, providing known good layer-pairs 10 and bond-ply layers 20 may comprise providing layer-pair and bond-ply panels (2 and 3), each panel (2 or 3) comprising multiple layer-pairs 10 or bond-plys 20, testing the individual layer-pairs 10 and bond-plys 20, and singulating/breaking up the panels into individual parts with only the good parts being used in later steps. Singulation of individual parts may be accomplished by any means including manually cutting the parts from the panel as well as through the use of automated methods. It is contemplated that laser cutting or the use of a steel ruled die would be advantageous. In some embodiments, the remains of the original panels may be retained to create a framework for use in forming the individual parts back into a panel. The phantom lines of FIGS. 8 and 9 show one possible pattern for use in singulating panels 2 and 3.

Figure 10:
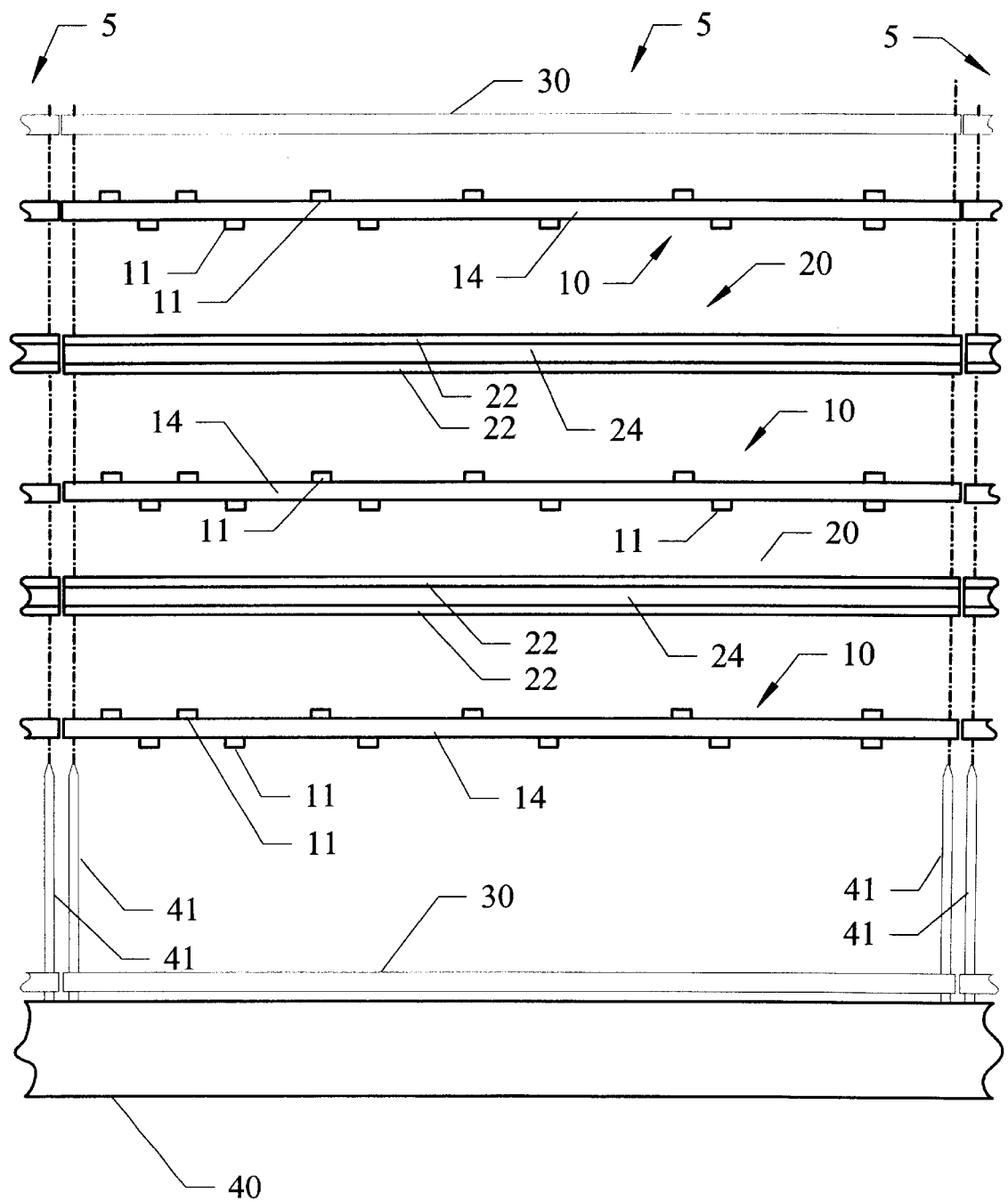
FIG. 10 is an exploded view of a stack/cell according to the disclosed invention.

Referring to FIG. 10, release sheets 30 are added to a top and a bottom lamination plate, the layer-pair and bond-ply layers 10 and 20 are press fitted onto tooling pins 41 of the bottom lamination plate 40, the top lamination plate is added, and the resulting sandwich is vacuum laminated in a press to form panels of known good parts. The bottom lamination plate 40 is preferred to hold all the pieces of the panel (2 or 3).

After the final/top lamination plate is added, the stacks are pressed to cause adhesive layers 22 to flow and to fill in the empty spaces between conductive patterns 11 and between cells/stacks 5. After the adhesive layers have been caused to flow and while maintaining pressure on the stacks 5, everything is then heated to cure the adhesive portions and to cause sintering of the conductive ink After heating/curing, at least some of the cured portions interconnect the stacks so as to form a panel. It is contemplated that interlocking the pieces prior to panelization helps alleviate problems of brittleness. In a less preferred process, the base material frameworks left after singulation of the layer-pair and bond-plys are used to help fill the gap between stacks. During panelization, there a slight increase in the distance between cells/pieces.

HDI formation, in addition to the steps previously described, may include additional steps such as, but not necessarily limited to, e-less nickel plating; soldermasking; e-less gold plating; stack singulation; electrical test; and final inspection steps.

Thus, specific embodiments of HDIs and methods for forming HDIs have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method for producing a multi-celled assembly of high density interconnects comprising at least 3 layer-pairs wherein the percentage yield for the resulting multi-celled assembly is at least 90%.

2. The method of claim 1 wherein the high density interconnect comprises at least N layer-pairs and N is one of 4, 5, 6, 7, 8, 9, 10.

3. The method of claim 2 wherein the percentage yield for the resulting multi-celled unit is at least Y% where Y is one of 95, 98, 99, and 99.5.

4. A method for producing a multi-celled assembly comprising:

providing a panel comprising two layer pairs separated by a distance D;

producing a second panel comprising the two layer pairs separated by a distance E wherein E is not equal to D.

* * * * *